United States Patent
Park et al.

(10) Patent No.: US 7,145,332 B2
(45) Date of Patent: Dec. 5, 2006

(54) MAGNETIC FIELD SENSING DEVICE AND METHOD FOR FABRICATING THEREOF

(75) Inventors: Hae-seok Park, Seoul (KR); Kyung-won Na, Yongin-si (KR); Dong-sik Shim, Seoul (KR); Sang-on Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/433,570

(22) Filed: May 15, 2006

(65) Prior Publication Data

US 2006/0202690 A1 Sep. 14, 2006

Related U.S. Application Data

(62) Division of application No. 10/773,456, filed on Feb. 9, 2004, now Pat. No. 7,071,688.

(30) Foreign Application Priority Data

Feb. 10, 2003 (KR) ................. 2003-08343

(51) Int. Cl.
*G01R 33/03* (2006.01)
(52) U.S. Cl. ............... 324/249; 438/3; 324/252
(58) Field of Classification Search ................ 324/249, 324/252; 438/3
See application file for complete search history.

(56) References Cited

U.S. PATENT DOCUMENTS

| 6,411,086 B1 | 6/2002 | Choi et al. |
| 6,414,564 B1 | 7/2002 | Mizoguchi et al. |
| 6,429,651 B1 | 8/2002 | Choi et al. |
| 6,472,868 B1 * | 10/2002 | Takayama et al. .......... 324/249 |
| 2003/0006763 A1 | 1/2003 | Takayama et al. |
| 2003/0173963 A1 | 9/2003 | Choi et al. |

FOREIGN PATENT DOCUMENTS

| DE | 42 20 186 A1 | 12/1993 |
| EP | 1 345 038 A2 | 9/2003 |
| EP | 1 441 234 A2 | 7/2004 |
| JP | 01-163686 A | 6/1989 |
| JP | 2003-004831 A | 1/2003 |

\* cited by examiner

*Primary Examiner*—Bot LeDynh
(74) *Attorney, Agent, or Firm*—Sughrue Mion, PLLC

(57) ABSTRACT

Disclosed is a magnetic field sensor of high sensitivity, and which is power-saving and can be manufactured with low cost in a very small size. The magnetic field sensor includes a soft magnetic core formed to construct a closed-magnetic circuit on a semiconductor substrate, a magnetic field sensing coil formed by a metal film in a shape that winds the soft magnetic core, and a drive line for exciting the soft magnetic core by directly applying an electric current thereto. The drive line is formed in a rectangular angle to the magnetic field sensing coil, and connected to the both ends of the soft magnetic core in a length direction.

7 Claims, 6 Drawing Sheets

MAGNETIC FIELD SENSING DEVICE AND METHOD FOR FABRICATING THEREOF

This is a divisional of application Ser. No. 10/773,456 filed Feb. 9, 2004 now U.S. Pat. No. 7,071,688. The entire disclosure of the prior application, application Ser. No. 10/773,456 is hereby incorporated by reference.

CROSS-REFERENCE TO RELATED APPLICATIONS

This application claims the benefit of Korean Application No. 2003-08343, filed Feb. 10, 2003, in the Korean Intellectual Property Office, the disclosure of which is incorporated herein by reference.

BACKGROUND

1. Field of the Invention

The present invention relates to a sensor for a magnetic field, and more specifically, to a magnetic field sensor integrated in a semiconductor substrate and a method for fabricating the same.

2. Description of the Related Art

Existence of magnetic energy has been proven through various physical phenomena, and a magnetic field sensor enables a human to indirectly perceive magnetic energy, as it is unperceivable to human sense organs such as eyes and ears. As for the magnetic field sensor, a magnetic sensor employing a soft magnetic material and a coil has been used for a long time. The magnetic sensor is made by winding a coil around a relatively large bar-shaped core or an annular core formed of a soft magnetic ribbon. Also, an electronic circuit is employed to obtain a magnetic field in proportion to the measured magnetic field.

The conventional magnetic field sensor, however, has the following problems. That is, due to the structure of the conventional magnetic field sensor in which the coil is wound around a large bar-shaped core or an annular core made of soft magnetic ribbon, production costs are high, and the volume of the overall system is large.

Also, flux leakage is inevitable in the flux change due to the excitation coil and the detected magnetic field. Accordingly, high sensitivity cannot be guaranteed.

SUMMARY

The present invention has been made to overcome the above-mentioned problems of the prior art. Accordingly, it is an object of the present invention to provide a high sensitivity magnetic field sensor integrated in a semiconductor substrate capable of not only reducing manufacturing cost and overall volume of a system, but also detecting a magnetic field with more accuracy.

It is another object of the present invention to provide a method for manufacturing such a highly sensitive magnetic field sensor integrated in a semiconductor substrate capable of not only reducing manufacturing cost and overall volume of a system, but also detecting a magnetic field with more accuracy.

In order to achieve the above-described objects of the present invention, there is provided a magnetic field sensor integrated in a semiconductor substrate, comprising a soft magnetic core formed in a semiconductor substrate to construct a closed-magnetic circuit, a magnetic field sensing coil formed by a metal film in a structure of winding magnetic core, and a drive line for exciting the soft magnetic core by directly applying an electric current thereto.

Here, the drive line is formed in a rectangular angle to the magnetic field sensing coil and connected to both ends of the soft magnetic core in a length direction. The length direction of the soft magnetic core is in a magnetic field sensing axis.

In addition, the magnetic field sensing coil is wound in a solenoid pattern.

According to another aspect of the present invention, in order to achieve the above objects, there is provided a method for fabricating a magnetic field sensor integrated in a semiconductor substrate, comprising the steps of forming a pattern on a semiconductor substrate, corresponding to a lower part of the magnetic field sensing coil, and forming the lower part by first-putting metal into the pattern, forming a first insulation film on the semiconductor substrate where the metal is first-put, accumulating a soft magnetic material film on the first insulation film, and forming a soft magnetic core by patterning and etching, forming a second insulation film on the semiconductor substrate where the soft magnetic core is formed, forming on the second insulation film a penetrating hole for fluidly communicating with the first-put metal forming the lower part, and also forming a penetrating hole for fluidly communicating with the soft magnetic core, forming a pattern corresponding to an upper part and a soft magnetic core terminal of the magnetic field sensing coil on the second insulation film, and forming the upper part and the soft magnetic core terminal by second-putting metal into the pattern, forming a protection film on the semiconductor substrate where the metal is second-put, and opening the protection film so that the magnetic field sensing coil and the soft magnetic core terminal are connected with electric power.

Here, the method for formimg of the lower part of the magnetic field sensing coil comprises the steps of forming an oxide film on the semiconductor substrate, forming a conductive film on the oxide film, applying a photoresist on the conductive film, forming a pattern corresponding to a lower part of the magnetic field sensing coil by exposure and development, first-putting metal into an upper part of the semiconductor substrate such that the metal is filled in the patterned area, and removing the photoresist remaining after forming the pattern, and the conductive film which is the lower part of the remaining photoresist.

Additionally, the method for forming the soft magnetic core comprises the steps of forming a metal film on the first insulation film, applying a photoresist on the metal film, forming a pattern on the photoresist, corresponding to the soft magnetic core, by exposure and development, and removing the metal film on the area except for the patterned area, and removing the photoresist remaining after forming the pattern.

Further, the method for forming an upper part of the soft magnetic core comprises the steps of forming a conductive film on the second insulation film where the penetrating hole is formed, applying a photoresist on the conductive film, forming a pattern on the photoresist, corresponding to an upper part of the magnetic field sensing coil, by exposure and development, second-putting metal to fill in the patterned area, and removing the photoresist remaining after forming the pattern and the conductive under the remaining photoresist.

Here, the soft magnetic core terminal is preferably formed on both ends of the soft magnetic core in a length direction.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Hereinafter, preferred embodiments of a magnetic field sensor integrated in a semiconductor substrate and a method for fabricating the same according to the present invention will be described in detail with reference to the accompanying drawings.

Figure 1:
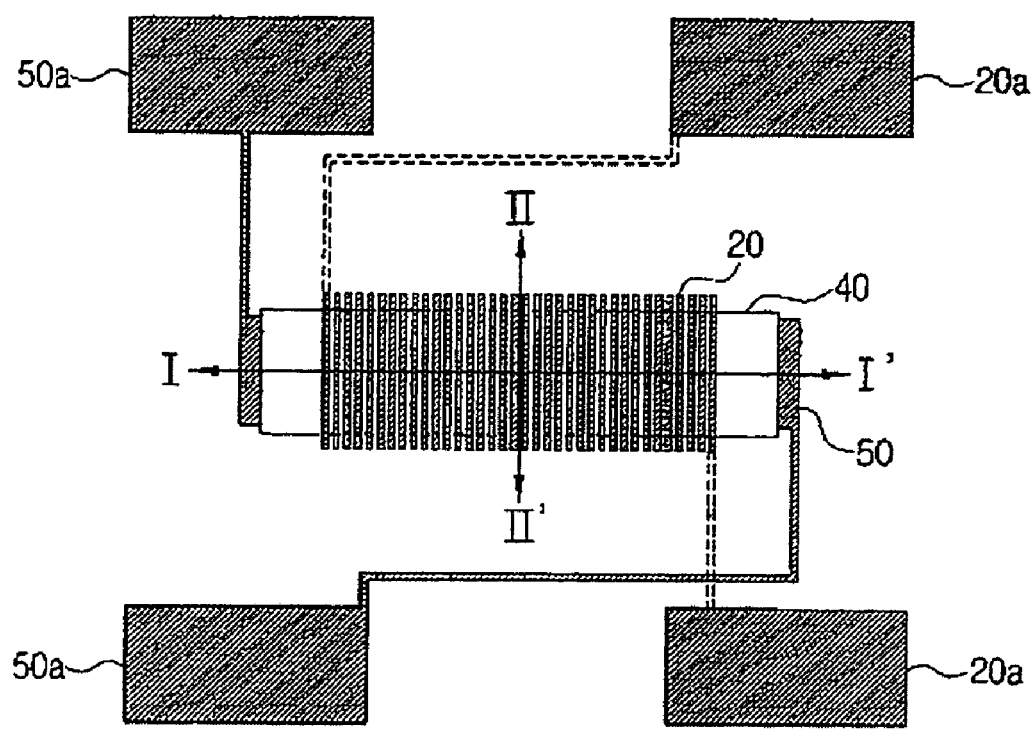
FIG. 1 is a plan view of a magnetic field sensor which is integrated in a semiconductor substrate according to a preferred embodiment of the present invention.

FIG. 1 is a plan view of a magnetic field sensor which is integrated in a semiconductor substrate according to a preferred embodiment of the present invention. Referring to FIG. 1, the magnetic field sensor comprises a soft magnetic core 40 shaped in a rectangular bar, a magnetic field sensing coil 20 winding the soft magnetic core 40 in a solenoid pattern, and a drive line 50 connected to both ends of the soft magnetic core 40. The magnetic field sensor according to the present invention does not use a separate coil to magnetize the soft magnetic core 40, but senses an external magnetic field using an exciting magnetic field which is generated as an electric current is applied directly to the soft magnetic core 40 through the drive line 50. That is, unlike the conventional magnetic field sensor, the magnetic field sensor according to the present invention does not use the exciting coil for generating the exciting magnetic field. A reference numeral 20a of FIG. 1 is a coil pad for connecting the magnetic filed sensing coil 20 to an external electric circuit (not shown), and a reference numeral 50a is a power pad for connecting an external electric power (not shown) to the drive line 50 applying the electric current to the soft magnetic core 40.

Figure 2:
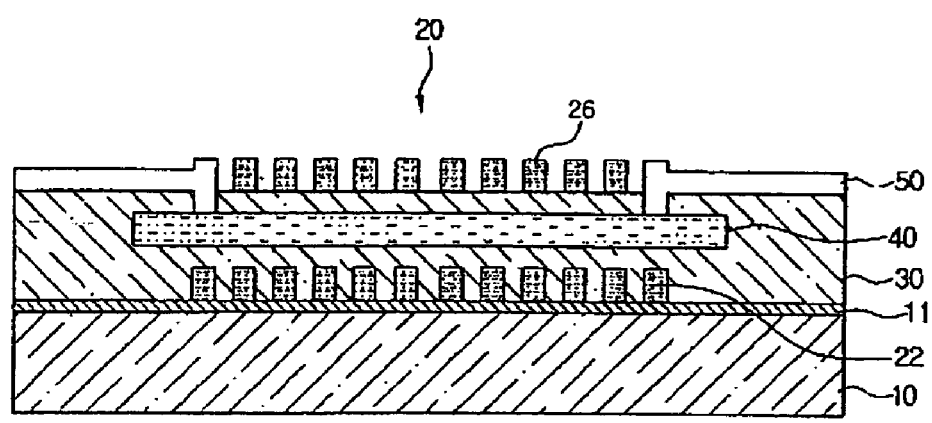
FIG. 2 is a sectional view of the structure of the magnetic field sensor integrated in a semiconductor substrate according to the present invention.

In FIG. 2, there is illustrated a sectional structure of the magnetic field sensor integrated in the semiconductor substrate. Referring to FIG. 2, an insulation film 11 is formed on the semiconductor substrate 10, and a lower part 22 of the magnetic field sensing coil 20 is formed on the insulation film 11. On an upper part of the lower part 22, the soft magnetic core 40 is formed. On the upper part of the soft magnetic core 40, an upper part 26 of the magnetic field sensing coil 20 is formed. Albeit not shown, the lower part 22 and the upper part 26 are fluidly communicated, to permit a coil to pass therethrough to wind the soft magnetic core 40 in a solenoid pattern. The soft magnetic core 40 is covered by an insulation material 30, and thus is insulated from the magnetic field sensing coil 20. Additionally, to the both ends of the soft magnetic core 40, drive lines 50 are connected to apply an exciting current to the soft magnetic core 40. The drive lines 50 are arranged in a rectangular angle as to the respective coils constructing the magnetic field sensing coil 20.

Hereinafter, the operation of the magnetic field sensor integrated in the semiconductor substrate will be described.

Figure 3:
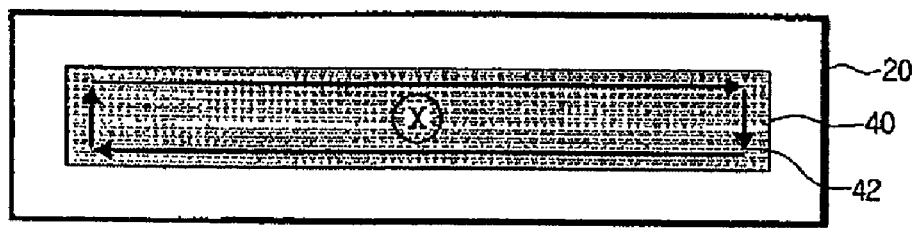
FIG. 3 is a view for illustrating a magnetic field generated on a soft magnetic core by an exciting current in the magnetic field sensor of FIG. 2.

When an electric current is applied through the drive line 50, an exciting magnetic field 42 is generated inside the soft magnetic core 40, as shown in FIG. 3. By the exciting magnetic field 42, the soft magnetic core 40 is magnetized. More specifically, due to a strong diamagnetism, magnetization occurs rarely in a thickness direction of the soft magnetic core 40, but usually in the exciting magnetic field 42 direction on the surface and the bottom side of the soft magnetic core 40. Such magnetization direction is in parallel relation to respective coils of the magnetic field sensing coil 20 which is wound on the soft magnetic core 40 in a solenoid pattern. The magnetization by the exciting magnetic field 42 on the soft magnetic core 40 varies depending on the extent of the exciting current flowing to the drive line 50 and the waveform thereof. Yet, in the embodiment of the present invention, since the magnetization direction of the soft magnetic core 40 is parallel to the coil winding direction of the magnetic field sensing coil 20, variation of the induction waveform according to change of the exciting current does not occur on the magnetic field sensing coil 20. Accordingly, when an external magnetic field to measure is zero, there occurs no induction waveform on the magnetic field sensing coil 20.

In such state, when an external magnetic field operates in a length direction of the soft magnetic core 40, a voltage is induced on the magnetic field sensing coil 20. Accordingly, the external magnetic field can be sensed by connecting the voltage to an external electric circuit.

A magnetic field sensor of the above structure does not need a separate exciting coil for magnetizing a soft magnetic core. Therefore, it is advantageous that intervals between coils can be cut down to the half, compared with a general conventional magnetic field sensor which is wound by a magnetic field sensing coil and an exciting coil by turns. Further, since the soft magnetic core 40 functions as the exciting coil, resistance can be changed freely by controlling a shape and a thickness of the soft magnetic core 40. Accordingly, power consumption can be saved by reducing the resistance of the soft magnetic core. Therefore, according to the present invention, the resistance of the soft magnetic core 40 which is the exciting coil can be minimized. In addition, the intervals of the magnetic field sensing coil can also be reduced to a degree of line-width fabrication of the current integrated circuit, thereby providing a magnetic field sensor of which the output of power and the sensitivity are remarkably increased.

FIGS. 4A through 4K are sectional views cut along I–I' line and II–II' line of FIG. 1 for respectively showing processes of fabricating the magnetic field sensor on a semiconductor substrate. In FIGS. 4A through 4K, the drawings on the left are sections of the magnetic field sensor being cut along the I–I' line, and the drawings on the right are the sections being cut along the I'–II' line.

Hereinafter, the fabrication process of the magnetic field sensor integrated in a semiconductor substrate will be described in greater detail with reference to the accompanying drawings.

First, a pattern according to the lower part 22 of the magnetic field sensing coil 20 is formed, on a semiconductor substrate 10, and the lower part 22 is formed by primarily inserting metal into the pattern. A preferred embodiment of the process of fabricating the lower part 22 will now be described in detail.

Figure 4A:
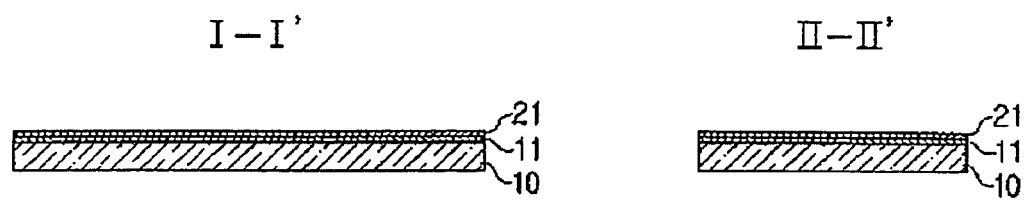
FIGS. 4A through 4K are sectional views cut along I–I' line and II–II' line of FIG. 1 for respectively showing processes of fabricating the magnetic field sensor of FIG. 1 in a semiconductor substrate.

An oxide film 11 for insulating is formed on the semiconductor substrate 10, and a conductive film 21 is formed on the oxide film 11. The conductive film 21 may have a function of applying an electric current later in case of plating by an electrolytic plating, as shown in FIG. 4A. Here, the material for forming the conductive film can be Cr or Au which are used in fabricating a general semiconductor.

Figure 4B:
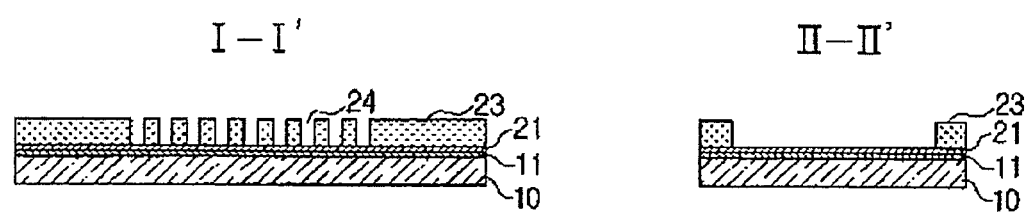

On the conductive film 21, a photoresist 23 is applied to form the lower part 22 of the magnetic field sensing coil 20, and the pattern of the lower part 22 is formed by exposure and development, as shown in FIG. 4B.

Figure 4C:
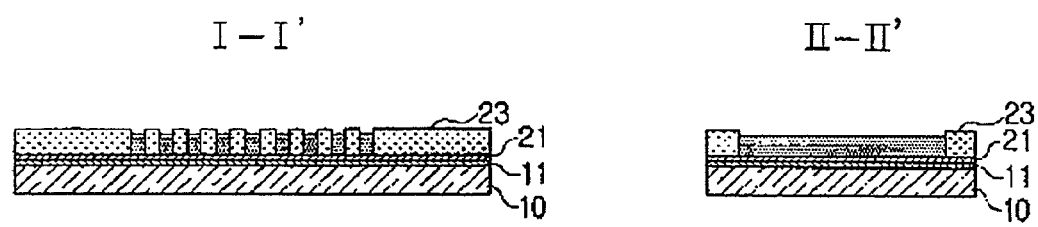
Figure 4D:
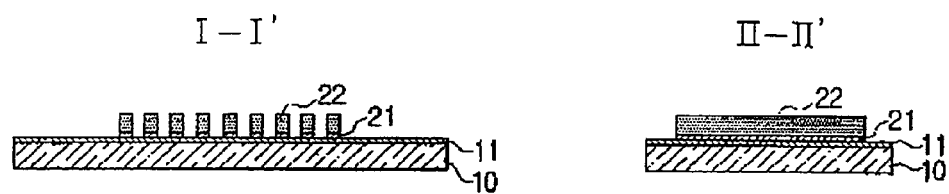

Later, the lower part 22 is formed as metal is inserted into the depression 24 of the pattern of the lower part 22, as shown in FIG. 4C. At this time, for filling the metal in the pattern of the lower part 22, an electrolytic plating is preferably used. Then, the metal is integrated in the conductive film 21 which is the exposed depression 24 of the pattern, and thereby forming the lower part 22 of the magnetic field sensing coil 20. When the lower part 22 is completed, the photoresist 23 used to form the pattern is removed, and the conductive film 21 disposed under the photoresist 23 is removed such that the respective coils are insulated from each other, as shown in FIG. 4D.

Figure 4E:
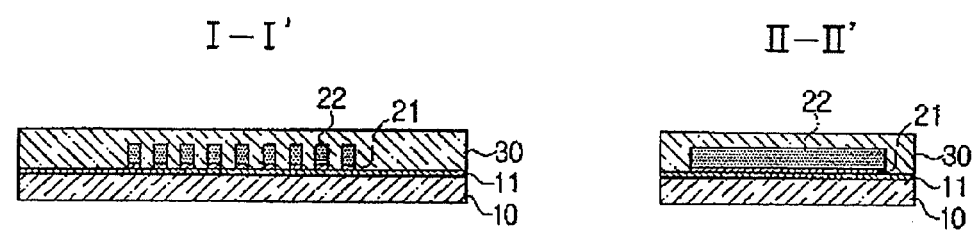

Then, a first insulation film 30 is formed on the semiconductor substrate 10 on which the lower part 22 is formed, as shown in FIG. 4E.

Then, a soft magnetic material film is integrated on the first insulation film 30, and the soft magnetic core 40 is formed by pattern-forming and etching. The process of forming the soft magnetic core 40 is described below in greater detail.

Figure 4F:
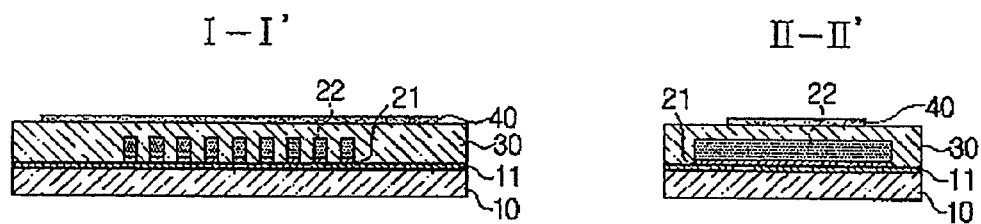

First, a soft magnetic material film is formed on the first insulation film 30, and the photoresist 23 is applied on the soft magnetic material film. Then, a pattern according to the soft magnetic core 40 is formed on the photoresist 23 by exposure and development. Next, the soft magnetic material film on the area where is patterned by etching is removed to form the soft magnetic core 40. After the soft magnetic core 40 is formed, remaining photoresist which was for the pattern of the soft magnetic core 40 is removed, as shown in FIG. 4F.

Figure 4G:
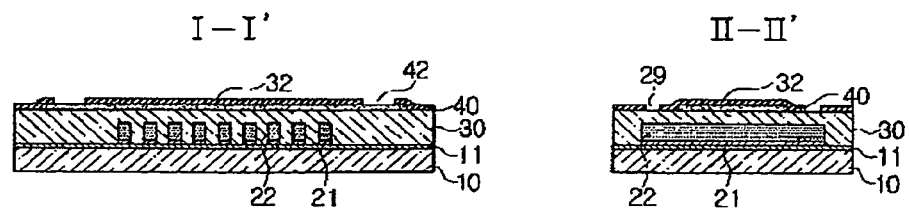

A second insulation film 32 is formed on the semiconductor substrate 10 where the soft magnetic core 40 is formed, and then a penetrating hole 29 which is fluidly communicated with the first-put metal forming the lower part 22 is formed. Here, near the both ends of the soft magnetic core 40 in a length direction, penetrating holes 42 are also formed for fluidly communicating with the soft magnetic core 40, as shown in FIG. 4G.

A pattern for the upper part 26 of the magnetic field sensing coil 20 is formed on the second insulation film 32, and then metal is secondarily put into the pattern to form the upper part 26. The process of fabricating the upper part 26 will be described in great detail through the following preferred embodiment.

Figure 4H:
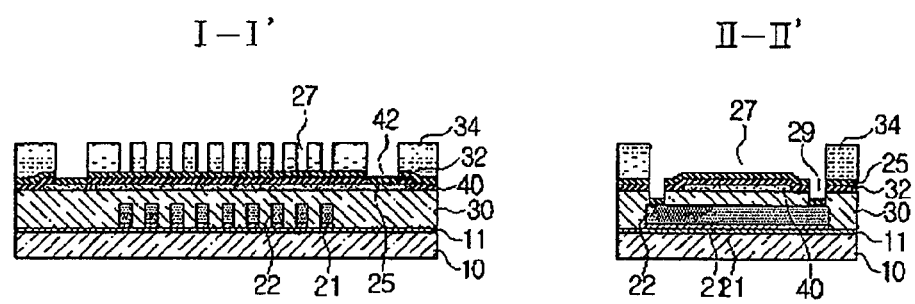
Figure 4I:
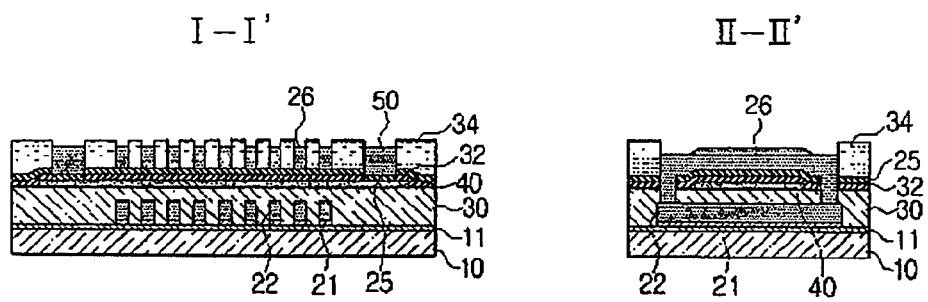
Figure 4J:
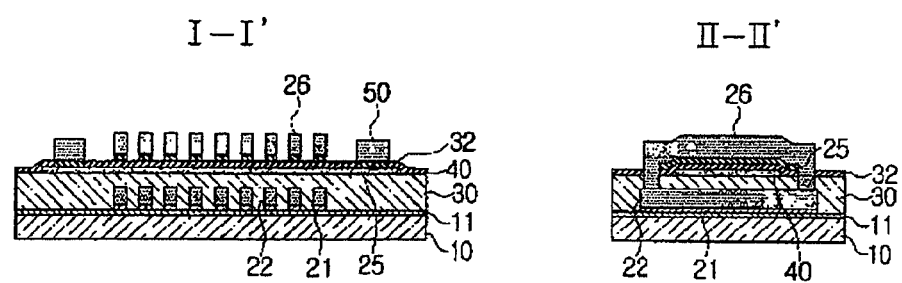
Figure 4K:
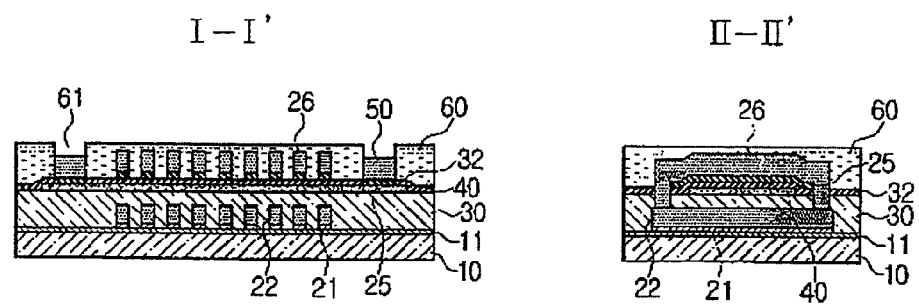

First, a conductive film 25 is formed on the second insulation 32 where the penetrating holes 29, 42 are formed, and a photoresist 34 is applied on the conductive film 25. Next, patterns corresponding to the upper part 26 and a soft magnetic core terminal 50 are formed on the photoresist 34 by exposure and development, as shown in FIG. 4H.

Then, in a depression 27 of the pattern of the upper part 26 and the depression 42 of the soft magnetic core terminal 50, metal is second-put, and thereby the upper part 26 and the soft magnetic core terminal 50 are formed. At this time, it is preferable that an electrolytic plating is used for filling the metal in the patterns of the upper part 26 and the soft magnetic core terminal 50. Accordingly, the metal is integrated in the conductive film 25 which is the exposed depressions 27, 42 of the pattern, and thereby forming the upper part 26 and the soft magnetic core terminal 50. When the upper part 26 and the soft magnetic core terminal 50 are completely formed, the photoresist 34 forming the patterns is removed. Then, the conductive film 25 under the photoresist 34 is removed such that the respective coils of the magnetic field sensing coil 26 and the soft magnetic core terminal 50 are insulated from each other.

Afterward, a protection film 60 is applied on the semiconductor substrate 10 where the upper part 26 is formed, and a penetrating hole 61 for fluidly communicating with the soft magnetic core terminal 50 and a penetrating hole (not shown) for fluidly communicating with the magnetic field sensing coil 20 are formed on the protection film 60. Thereby, the fabrication of the magnetic field sensor is completed.

As described above, the magnetic field sensor according to the present invention employs the soft magnetic core for the exciting coil. Therefore, the magnetic field sensing coil 20 can be formed compactly, having intervals thereof for forming line-width of the current integrated circuit, thereby improving the magnetic field sensitivity. Further, since the resistance of the soft magnetic core 40 can be reduced by controlling the shape and the thickness of the soft magnetic core, there can be provided a magnetic field sensor which is power-saving. Additionally, since an aspect ratio of the magnetic field sensing coil 20 does not have to be large to increase the sensitivity and save power consumption, the fabrication process becomes simple, also enabling mass-production by a semiconductor fabrication process, which causes a lower manufacturing cost.

As described above, the magnetic field sensor integrated in a semiconductor substrate according to the present invention can measure the magnetic field precisely with less power consumption. In addition, according to the present invention, a magnetic field sensor can be provided in a very small size and with economical in manufacturing cost.

Additionally, according to the fabrication process of the magnetic field sensor integrated in a semiconductor substrate according to the present invention, a magnetic field sensor can measure the magnetic field precisely, and can be provided in a very small size and economical in manufacturing cost.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a magnetic field sensor comprising the steps of:

forming a pattern on a semiconductor substrate, corresponding to a lower part of the magnetic field sensing coil, and forming the lower part by first-putting metal into the pattern;

forming a first insulation film on the semiconductor substrate where the metal is first-put;

accumulating a soft magnetic material film on the first insulation film, and forming a soft magnetic core by patterning and etching;

forming a second insulation film on the semiconductor substrate where the soft magnetic core is formed;

forming on the second insulation film a penetrating hole for fluidly communicating with the first-put metal forming the lower part, and also forming a penetrating hole for fluidly communicating with the soft magnetic core;

forming a pattern corresponding to an upper part of the magnetic field sensing coil on the second insulation film, and forming the upper part by second-putting metal into the pattern; and forming a protection film on the semiconductor substrate where the metal is second-put.

2. The method for fabricating a magnetic field sensor of claim 1, wherein the method for formimg of the lower part of the magnetic field sensing coil comprises the steps of:

forming an oxide film on the semiconductor substrate;

forming a conductive film on the oxide film;

applying a photoresist on the conductive film;

forming a pattern corresponding to a lower part of the magnetic field sensing coil by exposure and development;

first-putting metal into an upper part of the semiconductor substrate such that the metal is filled in the patterned area; and removing the photoresist remaining after forming the pattern, and the conductive film which is the lower part of the remaining photoresist.

3. The method for fabricating a magnetic field sensor of claim 1, wherein the method for forming the soft magnetic core comprises the steps of:

forming a soft magnetic material film on the first insulation film;

applying a photoresist on the soft magnetic material film;

forming a pattern on the photoresist, corresponding to the soft magnetic core, by exposure and development;

removing the soft magnetic material film except for the patterned area; and removing the photoresist remaining after forming the pattern.

4. The method for fabricating a magnetic field sensor of claim 1, wherein the method for forming an upper part of the soft magnetic core comprises the steps of:

forming a conductive film on the second insulation film where the penetrating hole is formed;

applying a photoresist on the conductive film;

forming a pattern on the photoresist, corresponding to an upper part of the magnetic field sensing coil, by exposure and development;

second-putting metal to fill in the patterned area; and removing the photoresist remaining after forming the pattern and the conductive under the remaining photoresist.

5. The method for fabricating a magnetic field sensor of claim 1, wherein the penetrating hole fluidly communicated with the soft magnetic core is formed on both ends of the soft magnetic core in a length direction.

6. The method for fabricating a magnetic field sensor of claim 5, wherein the length direction of the soft magnetic core is formed toward magnetic field sensing axis.

7. The method for fabricating a magnetic field sensor of claim 1, wherein the magnetic field sensing coil is wound in a solenoid pattern.

* * * * *